United States Patent [19]

Stetson

[11] Patent Number: 4,680,489
[45] Date of Patent: Jul. 14, 1987

[54] CONTROLLABLE PIECEWISE LINEAR GAIN CIRCUIT

[75] Inventor: Scott B. Stetson, Westminster, Calif.

[73] Assignee: Rockwell International Corporation, El Segundo, Calif.

[21] Appl. No.: 911,588

[22] Filed: Sep. 25, 1986

[51] Int. Cl.[4] .......................... H03G 3/32; H04N 9/77; H04N 3/14

[52] U.S. Cl. ...................................... 307/493; 377/60; 358/213.18; 358/213.26; 358/167; 330/278; 307/304

[58] Field of Search ................ 358/36, 172, 174, 167, 358/212, 213; 307/493, 304; 377/58, 60; 330/277, 278, 282, 283

[56] References Cited

U.S. PATENT DOCUMENTS

| | | | |
|---|---|---|---|
| 3,523,254 | 8/1970 | Royer | 330/283 |
| 3,671,931 | 6/1972 | Loofbourrow | 330/278 |
| 4,048,525 | 9/1977 | Goldberg et al. | 307/493 |
| 4,137,464 | 1/1979 | Heller et al. | 377/60 |
| 4,262,258 | 4/1981 | Gaalema | 328/151 |
| 4,309,678 | 1/1982 | Picquendar | 333/165 |
| 4,323,789 | 4/1982 | Dion | 307/596 |
| 4,384,276 | 5/1983 | Kelley et al. | 340/347 DA |
| 4,499,497 | 2/1985 | Levine | 358/213 |
| 4,500,924 | 2/1985 | Ohta | 358/213 |
| 4,513,321 | 4/1985 | Olson et al. | 358/172 |
| 4,528,684 | 7/1985 | Iida et al. | 377/60 |
| 4,556,851 | 12/1985 | Levine | 377/60 |
| 4,567,363 | 1/1986 | Goodnough | 330/9 |
| 4,567,525 | 1/1986 | Endo et al. | 358/213 |

OTHER PUBLICATIONS

Kosonocky, Charge-Coupled Digital Circuits, IEEE Journal of Solid-State Circuits, vol. SC-6, p. 314 (Oct., 1971).

Primary Examiner—John S. Heyman
Attorney, Agent, or Firm—H. Fredrick Hamann; Craig O. Malin; John J. Deinken

[57] ABSTRACT

A controllable, piecewise linear gain circuit includes a first field effect transistor (FET), the drain of which is connected to a first source of bias voltage and the gate of which is connected to the input to the circuit. A first capacitor is connected between the gate of the FET and a common ground. The drain of a second FET is connected to the gate of the first FET, while the gate of the second FET is connected to a second source of bias voltage. A second capacitor is connected between the source of the second FET and the common ground. With this configuration, the output voltage of the circuit may be measured across an output resistance connected between the common ground and the source of the first FET, such that the second FET will turn on and connect the second capacitor to the output of the circuit when a predetermined amount of charge has accumulated on the first capacitor, thereby reducing the gain of the circuit. The circuit may be adapted to receive the output from a charge coupled device, the gate of the first FET being connected to the output of the charge coupled device to periodically receive packets of electrical charge which are transferred through the charge coupled device. The circuit may also be adapted to provide the input for a multiplexer, the input of the multiplexer being connected between the common ground and the gate of the first FET to control the output voltage of the circuit.

5 Claims, 5 Drawing Figures

CONTROLLABLE PIECEWISE LINEAR GAIN CIRCUIT

GOVERNMENT RIGHTS

The U.S. Government has rights in this invention pursuant to a contract awarded by the Department of the Air Force.

BACKGROUND OF THE INVENTION

This invention is concerned with input and output circuits for solid state imaging systems utilizing a focal plane array of optical detectors.

The output circuit which is most commonly used with a charge coupled device (CCD) multiplexer for a focal plane array is the reset gate floating diffusion circuit. The design and operation of this circuit is straightforward, and its use with correlated double sampling removes switching transients, eliminates Nyquist noise associated with the reset switch/node capacitance combination, and suppresses 1/f noise contributions. The reset gate floating diffusion circuit designs known in the prior art, however, provide only a single value for the charge-to-voltage conversion ratio, or output circuit gain, regardless of the amount of charge which is input to the circuit. A single value for the gain is not always optimum over the range of charge which can occur in a typical application. The accommodation of large (near full well) charge packets, for example, may require a low gain, whereas a high gain is preferred with small charge packets to minimize the noise of the electronics and to achieve CCD or detector noise limited performance. Different values of gain are also desirable, for similar reasons, in multiplexer detector input circuits for such applications as space surveillance and infrared astronomy. A high gain is needed for low noise performance in low background environments, while a low gain is required at high background levels to provide sufficient dynamic range and prevent the multiplexer from saturating. A need has thus developed in the art for a circuit which can be controllably switched from a high gain mode, which can be used when low noise requirements can be met, to a low gain mode, which can be used when a large dynamic range requirement can be satisfied.

SUMMARY OF THE INVENTION

The invention provides a controllable, piecewise linear gain circuit, which includes a first field effect transistor (FET), the drain of which is connected to a first source of bias voltage and the gate of which is connected to the input to the circuit. A first capacitor is connected between the gate of the FET and a common ground. The drain of a second FET is connected to the gate of the first FET, while the gate of the second FET is connected to a second source of bias voltage. A second capacitor is connected between the source of the second FET and the common ground. With this configuration, the output voltage of the circuit may be measured across an output resistance connected between the common ground and the drain of the first FET, such that the second FET will turn on and connect the second capacitor to the output of the circuit when a predetermined amount of charge has accumulated on the first capacitor, thereby reducing the gain of the circuit.

In a more particular embodiment, the circuit is adapted to receive the output from a charge coupled device, the gate of the first FET being connected to the output of the charge coupled device to periodically receive packets of electrical charge which are transferred through the charge coupled device.

In another embodiment, the circuit is adapted to provide the input for a multiplexer, the input of the multiplexer being connected between the common ground and the gate of the first FET to control the output voltage of the circuit.

DESCRIPTION OF THE INVENTION

Figure 1:
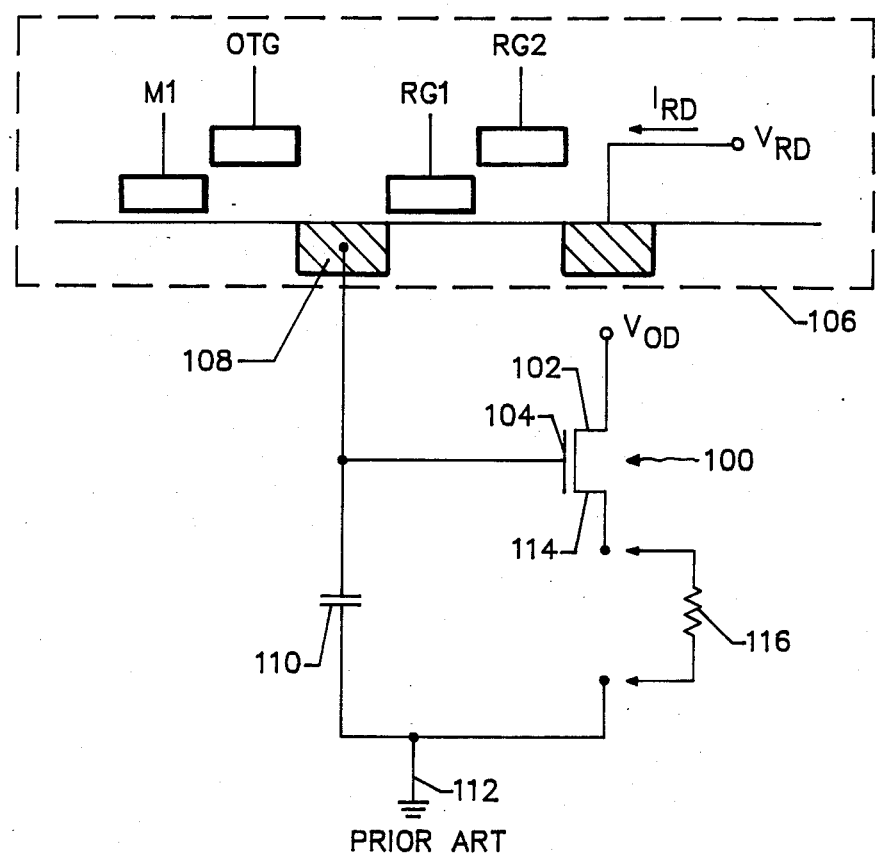
FIG. 1 is an electrical schematic illustrating a reset gate floating diffusion output circuit typical of the prior art.

FIG. 1 is an electrical schematic illustrating a reset gate floating diffusion output circuit typical of the prior art. The circuit includes a field effect transistor (FET) 100, whose drain 102 is connected to a source of bias voltage $V_{OD}$. The gate 104 of the FET 100 is connected to the output of a CCD 106 through the floating diffusion 108. A capacitor 110 is connected between the gate 104 and a common ground 112. The output from the circuit is obtained between the source 114 of the FET 100 and the ground 112, with the output voltage being measured across an output resistance 116 (the output resistance being external to the output circuit). The measured output voltage will be proportional to the amount of charge transferred by the CCD. This circuit provides a single value for the charge-to-voltage conversion ratio, or output circuit gain (OCG). The gain (in units of volts per electron) is determined by the total floating diffusion node capacitance and source follower gain as given by:

$$OCG = Kq/C_{110} \tag{1}$$

where K is the gain of the source follower circuit composed of the FET 100 and the resistance 116, $C_{110}$ is the total effective floating diffusion node capacitance, and q is the electronic charge.

The design value of $C_{110}$ is normally set by the maximum charge delivered by the CCD along with the maximum voltage swing that can be tolerated by the following signal processing circuitry. This limits the output gain to a single value, which is not always desirable. It is an outstanding feature of this invention to provide a circuit which will select a high value of gain when sensing small charge packets, while switching to a lower value of gain for sensing large charge packets, thereby implementing a controllable, piecewise linear circuit gain characteristic.

Figure 2:
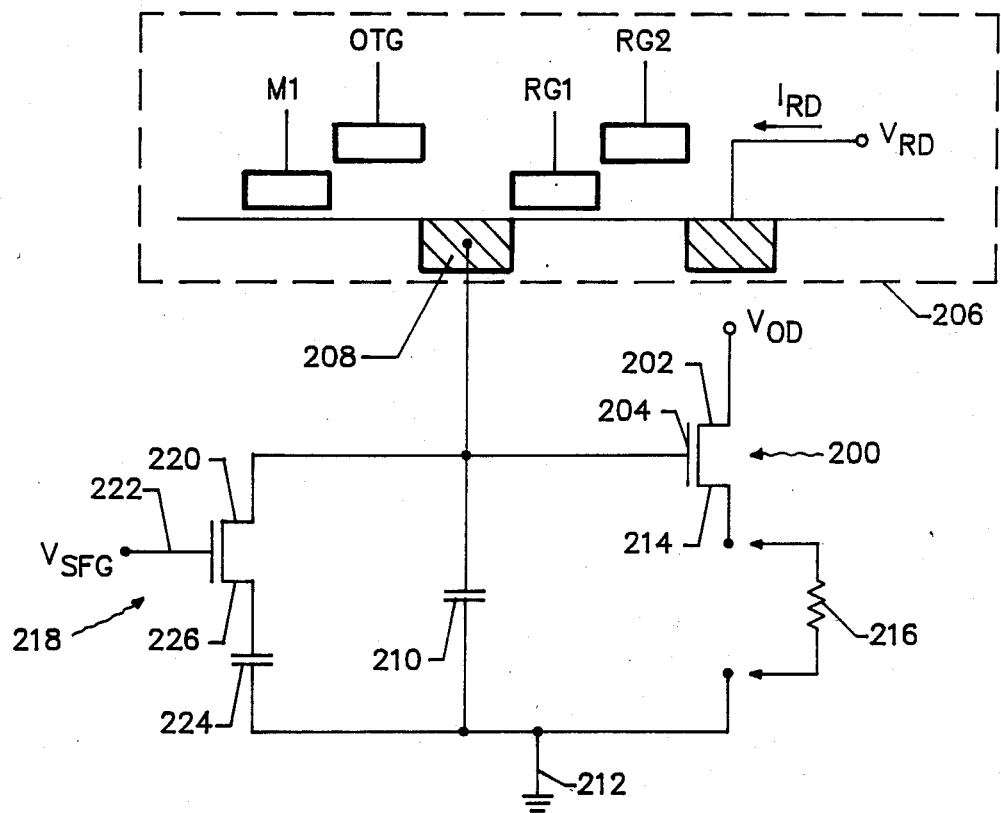
FIG. 2 is an electrical schematic for a circuit which is similar to FIG. 1 but illustrates one embodiment of the controllable, piecewise linear output circuit of this invention.

FIG. 2 is an electrical schematic for a circuit which is similar to FIG. 1 but illustrates one embodiment of the controllable, piecewise linear output circuit of this invention. In FIG. 2, a first FET 200 has its drain 202 connected to a first source of bias voltage $V_{OD}$, while its gate 204 is connected to the floating diffusion 208 of a CCD 206. A first capacitor 210 is connected between the gate 204 of the FET 200 and a common ground 212. The voltage output from this circuit is measured across the resistance 216 between the common ground 212 and the source 214 of the FET 200. A second FET 218 has its drain 220 connected to the gate 204 of the first FET 200 and its gate 222 connected to a second source of bias voltage $V_{SFG}$ (Switching FET Gate Voltage). A second capacitor 224 is connected between the source 226 of the second FET 218 and the common ground 212.

The switching FET 218 and the capacitor 224 are used to obtain controllable, piecewise linear output circuit behavior in this invention. The FET 218 is used as a switch to introduce the additional capacitance 224 to the floating diffusion node, thereby decreasing the output circuit gain at a point determined by the charge $Q_{CCD}$ on the CCD 206 and by the applied bias $V_{SFG}$ on the gate 222 of the FET 218. The voltage present on the floating diffusion node 208 and the drain 220 of the FET 218 will be equal to $V_{RD}$ (the reset-drain voltage) minus $Q_{CCD}/C_{210}$ for a high output circuit gain state. The FET 218 will turn on when its gate-to-source voltage is greater than or equal to the threshold voltage, $V_T$, plus the body effect voltage, $V_{be}$, as given by the inequality $$V_{SFG} - (V_{RD} - Q_{CCD}/C_{210}) \geq V_T + V_{be} \qquad (2)$$

Therefore, the necessary charge level to turn the FET 218 on is $$Q_{CCD} = C_{210}(V_{RD} + V_T + V_{be} - V_{SFG}) \qquad (3)$$

Once the FET 218 has turned on, additional CCD charge is stored by the combined capacitance of capacitors 210 and 244, which reduces the incremental gain, so that the circuit is in a low gain state. Note that during the reset operation, the effective source and drain of the FET 218 are reversed, causing the capacitor 224 to be charged to an initial voltage $V_{SFG} - (V_T + V_{be})$.

If $V_{SFG}$ is greater than $V_{RD} + V_T + V_{be}$, the FET 218 will be turned on even for zero charge levels and a single, low output circuit gain (determined by the combined capacitance $C_{210} + C_{224}$ of capacitors 210 and 224) will be obtained for all charge levels. If $V_{SFG}$ is less than $V_{RD} + V_T + V_{be}$, the circuit will be in its high gain state until the charge level given by Equation (3) is reached, at which point the FET 218 will be turned on, placing the circuit in the low gain state. Thus the externally applied voltage $V_{SFG}$ determines the charge level at which the circuit switches from a high gain to a low gain state.

Further manipulation of Equation (3) yields a relationship between $\Delta V_{OUT}^s$, the output voltage change from the reset level at which switching from a high output current gain to a low output current gain occurs, and $V_{SFG}$ given by $$\Delta V_{OUT}^s = K(V_{RD} + V_T + V_{be} - V_{SFG}) \qquad (4)$$

Equation (4) can be used to determine the change in output voltage which occurs when the circuit switches from a high gain to a low gain state for given control voltages ($V_{RD}$ and $V_{SFG}$) and process parameters ($V_T$ and $V_{be}$).

The controllable piecewise linear mode of operation can be further extended by adding additional switching FET and capacitor combinations to the floating diffusion node. The addition of three FET/capacitor combinations, for example, could be used to obtain a transfer curve with four separate output current gain states and three switching points between these states.

Figure 3:
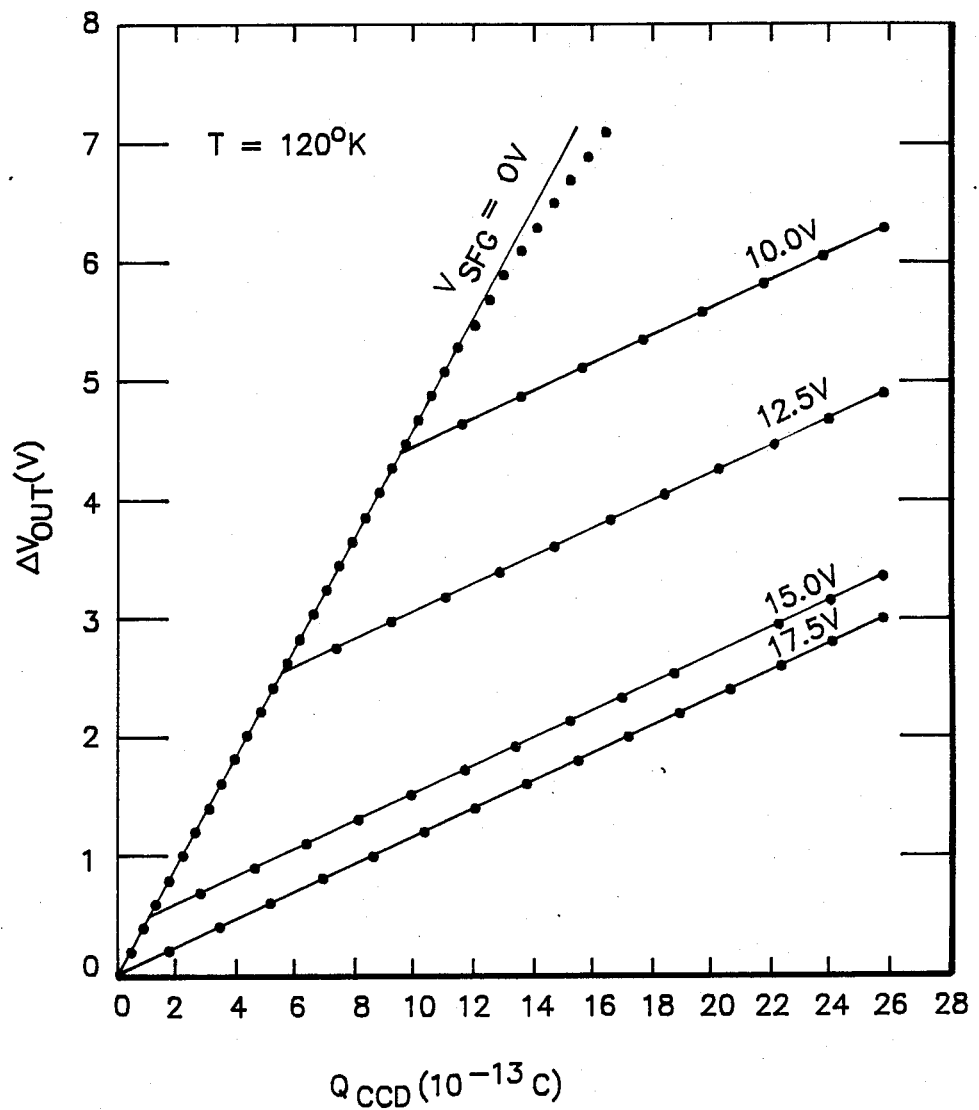
FIG. 3 is a graphical plot which illustrates $\Delta V_{OUT}$ versus $Q_{CCD}$ (from zero to full well) for various values of $V_{SFG}$, FIG. 4, which is a graphical plot of the output voltage change $\Delta V_{OUT}$ versus the charge on the CCD, $Q_{CCD}$.

The circuit of FIG. 2 has been implemented on a focal plane array multiplexer and its properties measured. The output current gain (OCG) was determined by measuring the reset drain current $I_{RD}$ as a function of $$\Delta V_{OUT}, \text{ as given by} \qquad (5)$$

$$OCG = (\Delta V_{OUT} qf)/I_{RD}$$

$$= (\Delta V_{OUT} q)/Q_{CCD}$$

$$= K_q/C_{210}$$

where f is the frequency at which the floating diffusion node is reset. A value for the floating diffusion node capacitance can be obtained from Equation (1) once values of the output current gain and K are measured. FIG. 3 is a graphical plot which illustrates $\Delta V_{OUT}$ versus $Q_{CCD}$ (from zero to full well) for various values of $V_{SFG}$. The high gain state results when $V_{SFG}=0$, while a value of $V_{SFG}=17.5$ V will place the circuit in the low gain state. The output current gain was found to be 0.70 and 0.18 uV/electron for the high and low gain states, respectively. Using these measured values of gain along with the measured value K=0.85, values of 0.19 and 0.76 pf for $C_{210}$ and $C_{210}+C_{224}$ were calculated. These values are in reasonably good agreement with the design values of 0.16 and 0.8 pf. Applied biases of 15.0, 12.5, and 10.0 V on the gate of the FET 218 caused the circuit to enter the low gain state after switching from a high gain state when charge levels corresponding to Equation (3) were reached for each setting of $V_{SFG}$. These curves indicate that the gain values in the low gain state all agree to within less than 8 percent. FIG. 3 illustrates the benefit of the controllable, piecewise linear output circuit of this invention; for $V_{SFG}=0$ V, the entire CCD charge capacity cannot be accommodated without a large nonlinear effect, which is due to the nonlinearity of the source follower circuit for large voltage swings. In contrast, with $V_{SFG} \geq 10.0$ V, the entire CCD capacity can be accommodated with two linear segments which can be easily calibrated.

Figure 4:
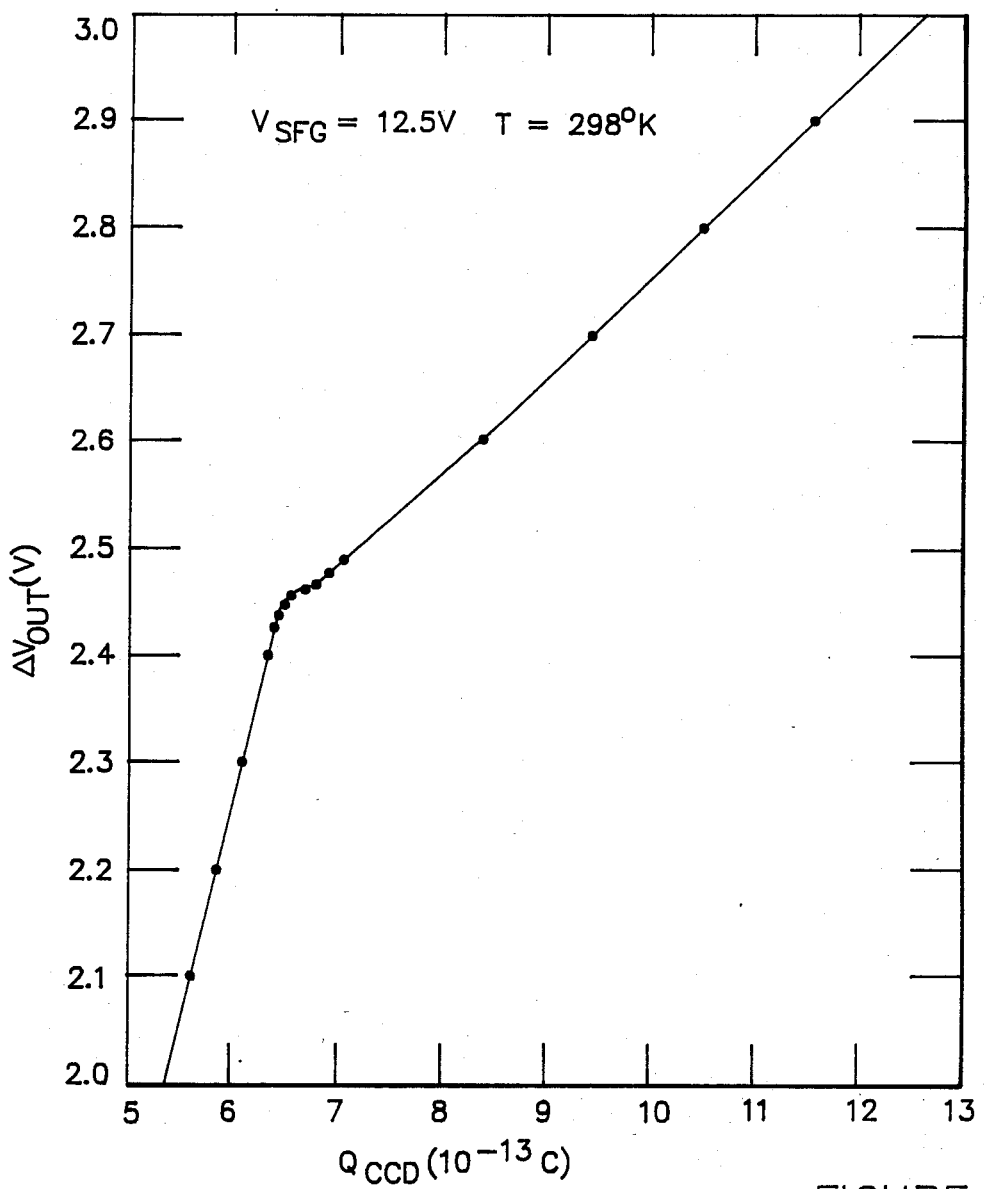

A more detailed measurement of the output circuit transfer characteristic in the region of one of the switching points is shown in FIG. 4, which is a graphical plot of the output voltage change $\Delta V_{OUT}$ versus the charge on the CCD, $Q_{CCD}$. A small amount of nonlinearity is evident in this region; it corresponds, however, to less than 2 percent of the total CCD charge dynamic range.

Additional measurements were made to verify the relationship given in Equation (4) between $\Delta V_{OUT}^s$ (where circuit switching occurs) and other circuit parameters. This equation was used to calculate $\Delta V_{OUT}^s$ using the measured values of K, $V_T$, and $V_{be}$ as a function of $V_{RD}$ and $V_{SFG}$, as given in Table I. A comparison of the measured and calculated values of $\Delta V_{OUT}^s$ shows that the two agree very well for the six conditions which are listed.

TABLE I

Comparison of Experimental and Predicted Circuit Switching Points

| | | | T = 298K | |
|---|---|---|---|---|
| $V_T = 1.0$ V | | $K = 0.85$ | Measured | Calculated |
| $V_{RD}$ (V) | $V_{SFG}$ (V) | $V_{be}$ (V) | $\Delta V^s_{OUT}$ (V) | $\Delta V^s_{OUT}$ (V) |
| 14.2 | 16.0 | 1.72 | 0.85 | 0.78 |
| 13.0 | 15.0 | 1.63 | 0.60 | 0.54 |
| 13.0 | 14.0 | 1.58 | 1.20 | 1.34 |
| 13.0 | 13.0 | 1.50 | 2.0 | 2.13 |
| 13.0 | 12.5 | 1.45 | 2.45 | 2.51 |
| 13.0 | 10.0 | 1.26 | 4.25 | 4.47 |

The controllable, piecewise linear output circuit is capable of accommodating large charge packets while still achieving CCD or detector noise limited performance with small charge packets. A particular application where this feature is useful is in the case of charge aggregation in a focal plane array where charge packets from a number (usually two or four) of single picture elements (pixels) are added together to create a large effective pixel.

Charge aggregation can be used to trade off between the resolution and responsivity of an imaging CCD array to optimize the focal plane array performance for a particular set of conditions. The resolution of an array is inversely proportional to the pixel size. On the other hand, as the pixel size is reduced to increase the resolution, the pixel responsivity is decreased (if all other operational parameters are held constant). The addition of single pixels will, therefore, decrease the resolution but increase responsivity. When charge is aggregated from two or more charge packets, the output circuit must be designed to handle the large total charge with a lower output circuit gain. While a low gain is necessary to accommodate these large effective charge packets, a high gain is still needed to provide CCD or detector noise limited performance to detect small charge packets. Use of the output circuit of this invention will fulfill both of these requirements by allowing the output circuit gain to change from a high value to a low value at a desired charge level determined by $V_{SFG}$, as given by Equation (3).

Figure 5:
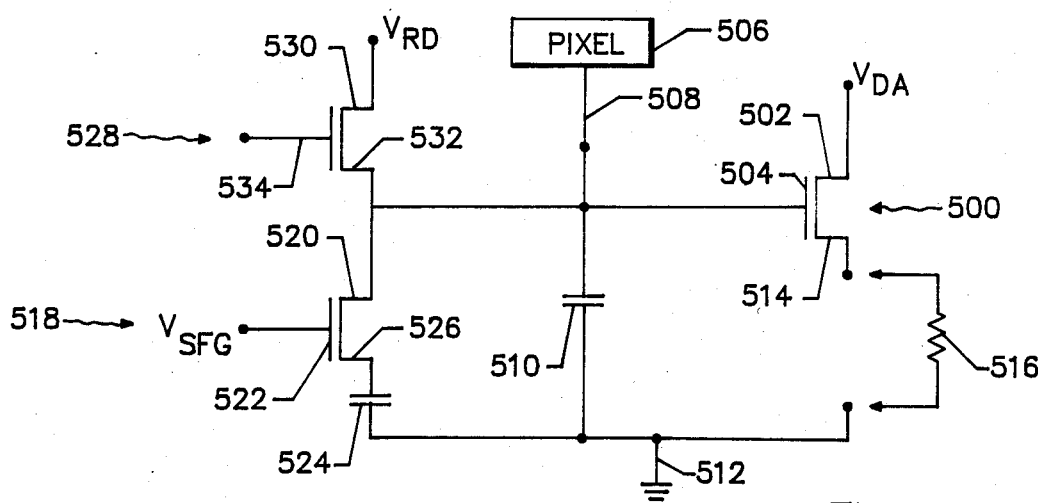
FIG. 5 is a schematic diagram illustrating another embodiment of the invention which is adapted for use as an input circuit of a switched MOSFET (SWIFET) multiplexer, which is designed to read out the signal from a solid state detector array.

FIG. 5 is a schematic diagram illustrating another embodiment of the invention which is adapted for use as an input circuit of switched MOSFET (SWIFET) multiplexer, which is designed to read out the signal from a solid state detector array. The SWIFET multiplexer directly integrates the charge from a single detector pixel on the input capacitance of a MOSFET source follower amplifier in each unit cell, converting the charge to a voltage. The resulting low noise voltage signal is directly read out on an output bus. In FIG. 5, a first FET 500 has its drain 502 connected to a first source of bias voltage, $V_{DA}$, while its gate 504 is connected to the output node 508 from a detector pixel 506. A first capacitor 510 is connected between the gate 504 of the FET 500 and a common ground 512. The voltage output from this circuit is measured between the common ground 512 and the source 514 of the FET 500. A second FET 518 has its drain 520 connected to the gate 504 of the first FET 500 and its gate 522 connected to a second source of bias voltage $V_{SFG}$ (Switching FET Gate Voltage). A second capacitor 524 is connected between the source 526 of the second FET 518 and the common ground 512. A reset FET 528 has its drain 530 connected to a source of reset voltage $V_{RD}$, while its source 532 is connected to the drain 520 of the second FET 518. Reset pulses are applied to the gate 534 of the reset FET 528.

The additional FET 518 and capacitor 524 are used, in a manner similar to that described in conjunction with FIG. 2, to obtain controllable, piecewise linear circuit behavior. The FET 518 is used as a switch to introduce the additional capacitance 524 to the detector input node, decreasing the output circuit gain at a point determined by the charge $Q_{DET}$ on the detector pixel 506 and by the applied bias $V_{SFG}$ on the gate 522 of the FET 518. The voltage present on the detector input node 508 and the drain 520 of the FET 518 is equal to $V_{RD}$ (the reset-drain voltage) minus $Q_{DET}/C_{510}$ for a high circuit gain state. The FET 518 will turn on when its gate-to-source voltage is greater than or equal to the threshold voltage, $V_T$, plus the body effect voltage, $V_{be}$, as given by the inequality $$V_{SFG} - (V_{RD} - Q_{DET}/C_{210}) \geq V_T + V_{be} \qquad (6)$$

Therefore, the necessary charge level to turn the FET 518 on is $$Q_{DET} = C_{510}(V_{RD} + V_T + V_{be} - V_{SFG}) \qquad (7)$$

As with the embodiment of FIG. 2, once the FET 518 has been turned on, additional charge is stored by the combined capacitance of capacitors 510 and 524, with the increased capacitance reducing the incremental gain so that the circuit is switched to the low gain state. The externally applied voltage $V_{SFG}$ determines the charges level at which the circuit switches from a high gain to a low gain state.

Here again, the controllable piecewise linear mode of operation can be further extended by adding additional switching FET and capacitor combinations to the source of the reset FET 528. The addition of three FET/capacitor combinations, for example, could be used to obtain a transfer curve with four separate circuit gain states and three switching points between these states. For a SWIFET multiplexer with a total output dynamic range from 0 to 0.5 V and with $V_{RD}$ equal to 6 V, $V_{SFG}$ must be greater than or equal to 8 V (assuming $V_T + V_{be}$ is approximately 2 V) for low gain operation. Because of a 0.5 V dynamic range, however, the useful range of $V_{SFG}$ (for selection of the high-to-low gain switching output voltage) is only from 7.3 to 8.0 V. This range is an order of magnitude less than that for a CCD multiplexer, which necessitates tighter control of $V_{SFG}$ for the SWIFET multiplexer.

The preferred embodiments of this invention have been illustrated and described above. Modifications and additional embodiments, however, will undoubtedly be apparent to those skilled in the art. The inventive concept, for example, need not be limited to the particular applications discussed herein. Furthermore, equivalent elements may be substituted for those illustrated and described herein, parts or connections might be reversed or otherwise interchanged, and certain features of the invention may be utilized independently of other features. Consequently, the exemplary embodiments should be considered illustrative, rather than inclusive, while the appended claims are more indicative of the full scope of the invention.

I claim:

1. A controllable, piecewise linear gain circuit, comprising:

a first field effect transistor, the drain of which is connected to a first source of bias voltage and the gate of which is connected to the input to the circuit;

a first capacitor connected between the gate of the first field effect transistor and a common ground;

a second field effect transistor, the drain of which is connected to the gate of the first field effect transistor and the gate of which is connected to a second source of bias voltage;

a second capacitor connected between the source of the second field effect transistor and the common ground;

whereby the output voltage of the circuit may be measured across an output resistance connected between the common ground and the source of the first field effect transistor, such that the second field effect transistor will turn on and connect the second capacitor to the output of the circuit when a predetermined amount of charge has accumulated on the first capacitor, thereby reducing the gain of the circuit.

2. The circuit of claim 1, wherein the circuit is adapted to receive the output from a charge coupled device, the gate of the first field effect transistor being connected to the output of the charge coupled device to periodically receive packets of electrical charge which are transferred through the charge coupled device.

3. The circuit of claim 1, wherein the circuit is adapted to provide the input for a multiplexer, the input to the multiplexer being connected between the common ground and the gate of the first field effect transistor to control the output voltage of the circuit.

4. A controllable, piecewise linear gain output circuit for a charge coupled device, comprising:

a first field effect transistor, the drain of which is connected to a first source of bias voltage and the gate of which is connected to the output of the charge coupled device to periodically receive packets of electrical charge which are transferred through the charge coupled device;

a first capacitor connected between the gate of the first field effect transistor and a common ground;

a second field effect transistor, the drain of which is connected to the gate of the first field effect transistor and the gate of which is connected to a second source of bias voltage;

a second capacitor connected between the source of the second field effect transistor and the common ground;

whereby the output voltage of the circuit may be measured across an output resistance connected between the common ground and the drain of the first field effect transistor, such that the second field effect transistor will turn on and connect the second capacitor to the output of the circuit when a predetermined amount of charge has accumulated on the first capacitor, thereby reducing the gain of the circuit.

5. A controllable, piecewise linear gain input circuit for a multiplexer, comprising:

a first field effect transistor, the drain of which is connected to a first source of bias voltage and the gate of which is connected to the input to the circuit;

a first capacitor connected between the gate of the first field effect transistor and a common ground;

a second field effect transistor, the drain of which is connected to the gate of the first field effect transistor and the gate of which is connected to a second source of bias voltage;

a second capacitor connected between the source of the second field effect transistor and the common ground;

wherein the input to the multiplexer is connected between the common ground and the gate of the first field effect transistor to control the output voltage of the circuit, such that the second field effect transistor will turn on and connect the second capacitor to the output when a predetermined amount of charge has accumulated on the first capacitor, thereby reducing the gain of the circuit.

* * * * *